(12) United States Patent
Yamasaki et al.

(10) Patent No.: US 8,575,620 B2
(45) Date of Patent: Nov. 5, 2013

(54) CIRCUIT BOARD AND DISPLAY DEVICE

(75) Inventors: Chikao Yamasaki, Osaka (JP); Shinya Tanaka, Osaka (JP); Tetsuo Kikuchi, Osaka (JP); Junya Shimada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/697,148

(22) PCT Filed: Jan. 25, 2011

(86) PCT No.: PCT/JP2011/051342
§ 371 (c)(1),
(2), (4) Date: Nov. 28, 2012

(87) PCT Pub. No.: WO2011/142147
PCT Pub. Date: Nov. 17, 2011

(65) Prior Publication Data
US 2013/0201610 A1    Aug. 8, 2013

(30) Foreign Application Priority Data

May 13, 2010    (JP) .................................. 2010-111423

(51) Int. Cl.
*H01L 27/14* (2006.01)
(52) U.S. Cl.
USPC .................................. 257/72; 257/66; 257/67
(58) Field of Classification Search
USPC ............................ 257/66, 67, 72; 345/87, 205
See application file for complete search history.

(56) References Cited

U.S. PATENT DOCUMENTS

| | | | |
|---|---|---|---|
| 5,585,647 A | 12/1996 | Nakajima et al. | |
| 2006/0145155 A1* | 7/2006 | Choi et al. | 257/59 |
| 2007/0284586 A1* | 12/2007 | Park et al. | 257/72 |
| 2008/0073651 A1* | 3/2008 | Ahn | 257/72 |
| 2009/0002590 A1 | 1/2009 | Kimura | |
| 2009/0321725 A1 | 12/2009 | Yoshida et al. | |
| 2010/0193785 A1 | 8/2010 | Kimura | |
| 2010/0213442 A1 | 8/2010 | Yoshida et al. | |

FOREIGN PATENT DOCUMENTS

| | | |
|---|---|---|
| JP | 62-73658 A | 4/1987 |
| JP | 07-092500 A | 4/1995 |
| JP | 2006-286772 A | 10/2006 |
| JP | 2009-033145 A | 2/2009 |
| JP | 2009-540623 A | 11/2009 |
| WO | 2008/075625 A1 | 6/2008 |

OTHER PUBLICATIONS

Official Communication issued in International Patent Application No. PCT/JP2011/051342, mailed on Mar. 1, 2011.

* cited by examiner

*Primary Examiner* — Boris L. Chervinsky
*Assistant Examiner* — Pete Lee
(74) *Attorney, Agent, or Firm* — Keating & Bennett, LLP

(57) ABSTRACT

The present invention provides a circuit board with a reduced circuit area, and a display device comprising the circuit board and a narrower picture frame. The circuit board of the present invention comprises: a bottom gate thin film transistor comprising a first semiconductor layer, a first gate electrode, a first source electrode, and a first drain electrode; and a top gate thin film transistor comprising a second semiconductor layer, a second gate electrode, a second source electrode, and a second drain electrode, wherein the first semiconductor layer and the second semiconductor layer are formed from the same material, and the first drain electrode or the first source electrode and the second gate electrode are connected without interposing any other thin film transistor therebetween, and have the same electric potential.

11 Claims, 11 Drawing Sheets

CIRCUIT BOARD AND DISPLAY DEVICE

TECHNICAL FIELD

The present invention relates to a circuit board and a display device. The present invention specifically relates to a circuit board which is suitably used as a driving circuit of a display device, and a display device comprising the circuit board.

BACKGROUND ART

Active matrix type display devices show images in response to selection in row units of pixel electrodes aligned in a matrix state and to writing of voltages corresponding to the display data of the selected pixel electrodes. In order to select the pixel electrodes in row units, switching elements such as thin film transistors (TFTs) are required to be provided in the display device. In the case of using TFTs, it is necessary to provide driving circuits such as a gate driver and a source driver. The TFT is a field effect transistor comprising a semiconductor layer and three terminals, that is, a gate electrode, a source electrode, and a drain electrode. The gate electrode is connected to a gate driver and the source electrode is connected to a source driver. The source electrode is also connected to a drain electrode through the semiconductor layer.

Driving circuits are commonly integrated into an IC (integral circuit) chip, and are attached outside a panel. Even in the driving circuits attached outside the panel, TFTs are suitably used and enable high-speed operation of elements such as a gate driver and a source driver. Examples of the material widely used for a semiconductor layer of a TFT include silicon-based materials such as noncrystalline silicon (amorphous silicon), microcrystalline silicon, multicrystalline silicon (polysilicon), and monocrystalline silicon. TFTs are generally classified into a bottom gate type, in which the gate electrode is formed on a lower layer than the source electrode and the drain electrode, and a top gate type, in which the gate electrode is formed on an upper layer than the source electrode and the drain electrode.

The material to be used for a semiconductor layer and selection of the bottom gate type or the top gate type may be appropriately decided depending on the design. For example, a top gate transistor having a semiconductor layer formed from monocrystalline silicon and a bottom gate transistor having a semiconductor layer formed from amorphous silicon may be formed on the same substrate so as to provide transistors with different characteristics to the same substrate (for example, see Patent Literature 1).

Currently, from the viewpoint of reducing the cost and the picture frame size, a gate monolithic circuit having a pixel part and a driving circuit part on the same panel is being developed. For example, methods are studied for producing a TFT at pixel part and a TFT at driving circuit part simultaneously.

CITATION LIST

Patent Literature

Patent Literature 1: JP 2009-33145 A

SUMMARY OF INVENTION

Technical Problem

In production of gate monolithic type display devices, the present inventors have performed various studies for reducing the area of a driving circuit part to narrow the picture frame. FIG. 18 is a circuit diagram showing a part of a driving circuit of a common display device. As shown in FIG. 18, the driving circuit of a display device may have a portion where the drain electrode of an upstream TFT 101 is connected to the gate electrode of a downstream TFT 102 at a part of the circuit, in some cases.

In such a circuit, each TFT has the following structure. FIG. 19 is a schematic plan view showing a part of the structure of a TFT of a driving circuit of a common display device. FIG. 20 is a schematic cross-sectional view showing a part of the structure of a TFT of a driving circuit of a common display device.

As shown in FIG. 19, in the case of using a comb-shaped source electrode 125 and drain electrode 126, the teeth of the source electrode 125 and those of the drain electrode 126 are oppositely interposed at uniform intervals, and a gate electrode 121 is placed so as to overlap the whole of these teeth. A gate insulator and a semiconductor layer 123 are placed between the gate electrode 121 and the source electrode 125 and drain electrode 126. At the timing when a signal is supplied to the gate electrode 121, a signal supplied to the source electrode 125 is supplied to the drain electrode 126 via the semiconductor layer 123.

As shown in FIG. 20, each of the upstream TFT 101 and the downstream TFT 102 is formed by lamination of a gate electrode 121, a gate insulator 122, a semiconductor layer 123, an interlayer insulator 124, a source electrode 125, a drain electrode 126, and an interlayer insulator 127. Between the upstream TFT 101 and the downstream TFT 102 is required to be formed a region for connecting the gate and the source or drain. Thus, a contact portion 105 for connecting the drain electrode 126 of the upstream TFT 101 and the gate electrode 121 of the downstream TFT 102 is formed between the upstream TFT 101 and the downstream TFT 102. The contact portion 105 is formed by forming a contact hole inside the interlayer insulator 124 and the interlayer insulator 127, and by disposing a transparent conductive film 155 such that it covers the surfaces of the exposed gate electrode 121, interlayer insulator 124, drain electrode 126, and interlayer insulator 127.

Formation of such a contact portion, however, is not preferable from the viewpoint of narrowing the picture frame of a display device. The contact portion needs to be formed separately in parallel with the first TFT and the second TFT, as well as it needs to be formed with an excessively large area in consideration of the alignment accuracy of photolithography, variation in finishing quality of contact holes for electrical connection, and reduction in contact resistance between electrodes, for example. Therefore, such a structure can be further improved from the viewpoint of narrowing the picture frame of a display device.

The present invention is devised under the aforementioned situation, and aims to provide a circuit board with a reduced circuit area, and a display device comprising such a circuit board and has a narrower picture frame.

Solution to Problem

The present inventors have performed various studies on the structure of a TFT which is effective for reduction in the circuit area, and thereby focused on a contact portion for connecting the drain or source electrode and the gate electrode of different TFTs to each other. Then, the present inventors have found that the circuit structure in which all TFTs are of either the bottom gate type or the top gate type needs to have an additional contact portion. They also have found that in the case that the electrodes are connected using two TFTs with opposite structures, that is, a bottom gate TFT and a top gate TFT, and using semiconductor layers formed from the same material, the gate electrode and the drain or source electrode of the respective TFTs with substantially the same characteristics can be connected without forming a contact portion for connecting the gate electrode and the drain or source electrode. As a result, the present inventors have arrived at the solution to solve the problems, and completed the present invention.

In other words, the present invention relates to a circuit board, comprising: a bottom gate thin film transistor comprising a first semiconductor layer, a first gate electrode, a first source electrode, and a first drain electrode; and a top gate thin film transistor comprising a second semiconductor layer, a second gate electrode, a second source electrode, and a second drain electrode, the first semiconductor layer and the second semiconductor layer being formed from the same material, and the first drain electrode or the first source electrode and the second gate electrode being connected without interposing any other thin film transistor therebetween, and having the same electric potential (hereinafter, also referred to as a first circuit board of the present invention).

The present invention also relates to a circuit board, comprising: a top gate thin film transistor comprising a third semiconductor layer, a third gate electrode, a third source electrode, and a third drain electrode; and a bottom gate thin film transistor comprising a fourth semiconductor layer, a fourth gate electrode, a fourth source electrode, and a fourth drain electrode, the third semiconductor layer and the fourth semiconductor layer being formed from the same material, and the third drain electrode or the third source electrode and the fourth gate electrode being connected without interposing any other thin film transistor therebetween, and having the same electric potential (hereinafter, also referred to as a second circuit board of the present invention).

The configurations of the first and second circuit boards of the present invention are not especially limited by other components as long as they essentially include such components. Further, both the combination of the thin film transistors having the structure of the first circuit board of the present invention and the combination of the thin film transistors having the structure of the second circuit board of the present invention may be formed in one circuit board.

The first circuit board of the present invention comprises a bottom gate thin film transistor that comprises a first semiconductor layer, a first gate electrode, a first source electrode, and a first drain electrode, and a top gate thin film transistor that comprises a second semiconductor layer, a second gate electrode, a second source electrode, and a second drain electrode. The second circuit board of the present invention comprises a top gate thin film transistor that comprises a third semiconductor layer, a third gate electrode, a third source electrode, and a third drain electrode, and a bottom gate thin film transistor that comprises a fourth semiconductor layer, a fourth gate electrode, a fourth source electrode, and a fourth drain electrode. In the present description, the bottom gate thin film transistor (TFT) means a TFT in which the gate electrode is placed on a lower layer than both the source electrode and the drain electrode, whereas the top gate thin film transistor (TFT) means a TFT in which the gate electrode is placed on an upper layer than both the source electrode and the drain electrode.

The first semiconductor layer and the second semiconductor layer are formed from the same material. Also, the third semiconductor layer and the fourth semiconductor layer are formed from the same material. The characteristics of a TFT substantially depend on the characteristics of its semiconductor layer. Thus, as the semiconductor layers of the bottom gate TFT and the top gate TFT are formed from the same material, TFTs with substantially the same characteristics can be obtained without any distinction between the bottom gate type and the top gate type. As a result, a good circuit can be obtained.

In the first circuit board of the present invention, the first drain electrode or first source electrode and the second gate electrode are connected without interposing any other thin film transistor therebetween, and have the same electric potential. In other words, in the first circuit board of the present invention, the drain electrode or the source electrode of the bottom gate TFT and the gate electrode of the top gate TFT are directly connected to each other. When a certain voltage is applied to the drain electrode or the source electrode of the bottom gate TFT, the same voltage is applied to the gate electrode of the top gate TFT. In other words, the drain electrode or the source electrode of the bottom gate TFT and the gate electrode of the top gate TFT are electrically the same component.

In the second circuit board of the present invention, the third drain electrode or third source electrode and the fourth gate electrode are connected without interposing any other thin film transistor therebetween, and have the same electric potential. In other words, in the second circuit board of the present invention, the drain electrode or the source electrode of the top gate TFT and the gate electrode of the bottom gate TFT are directly connected to each other. When a certain voltage is applied to the drain electrode or the source electrode of the top gate TFT, the same voltage is applied to the gate electrode of the bottom gate TFT. In other words, the drain electrode or the source electrode of the top gate TFT and the gate electrode of the bottom gate TFT are electrically the same component.

In the first and second circuit boards of the present invention, the combination of the bottom gate TFT and the top gate TFT constitutes a part of the circuit. Thus, an excessive contact portion is not required to be formed and, in the case that the circuit board is applied to a display device, for example, the picture frame can be narrowed.

The following will describe a preferable structure of the first and second circuit boards of the present invention.

In the first circuit board of the present invention, the first gate electrode, the second source electrode, and the second drain electrode are preferably formed from the same material. Further, the first gate electrode, the second source electrode, and the second drain electrode are preferably disposed on the same layer. Formation of these electrodes from the same material or placement of these electrodes on the same layer leads to improved efficiency of the production process.

In the second circuit board of the present invention, the third gate electrode, the fourth source electrode, and the fourth drain electrode are preferably formed from the same material. Further, the third gate electrode, the fourth source electrode, and the fourth drain electrode are preferably disposed on the same layer. Formation of these electrodes from the same material or placement of these electrodes on the same layer leads to improved efficiency of the production process.

In the first circuit board of the present invention, the materials of the first semiconductor layer and the second semiconductor layer are preferably oxide semiconductors. Further, in the second circuit board of the present invention, the materials of the third semiconductor layer and the fourth semiconductor layer are preferably oxide semiconductors. Preferable examples of the oxide semiconductors include those containing Ga (gallium), In (indium), Zn (zinc), and O (oxygen) as constituent atoms. Thereby, a TFT having excellent electrical properties and process stability can be easily achieved. Since the use of an oxide semiconductor provides sufficient conductive characteristics even with a small channel width, the size of a thin film transistor can be adjusted to be small and the circuit area can be reduced. The composition of the oxide semiconductor may be confirmed by auger electron spectroscopy (AES), X-ray photoelectron spectroscopy (XPS), or the like.

Preferably, the first circuit board of the present invention comprises a signal bus line; a gate-extracting line which extends from part of the signal bus line and which is connected to the first gate electrode; and a source-extracting line which extends from part of the signal bus line and which is connected to the first source electrode, wherein the first gate electrode and the gate-extracting line are formed from the same material, the first source electrode and the source-extracting line are formed from the same material, the signal bus line and the gate-extracting line are formed from different materials, the signal bus line is wider than the gate-extracting line in width, and the signal bus line and the gate-extracting line are connected through a contact portion which penetrates an insulator at a position overlapping the signal bus line.

Preferably, the second circuit board of the present invention comprises a signal bus line; a gate-extracting line which extends from part of the signal bus line and which is connected to the third gate electrode; and a source-extracting line which extends from part of the signal bus line and which is connected to the third source electrode, wherein the third gate electrode and the gate-extracting line are formed from the same material, the third source electrode and the source-extracting line are formed from the same material, the signal bus line and the gate-extracting line are formed from different materials, the signal bus line is wider than the gate-extracting line in width, and the signal bus line and the gate-extracting line are connected through a contact portion which penetrates an insulator at a position overlapping the signal bus line.

These structures focus on the fact that the bus line is thicker than the intra-circuit line in thickness. If an electrically connecting point between the gate-extracting line and the signal bus line is formed at a position overlapping the signal bus line, a contact portion is not required to be formed in the circuit, and thus the circuit area can be reduced.

The present invention also relates to a display device comprising at least one of the first and second circuit boards of the present invention. Since the first and second circuit boards of the present invention enable to reduce the circuit area, a display device with a small frame area can be obtained.

Advantageous Effects of Invention

In the circuit board of the present invention, the combination of the bottom gate TFT and the top gate TFT constitutes a part of the circuit. Thus, an excessive contact portion is not required to be formed and the circuit area can be reduced. As a result, in the case that the circuit board is applied to a display device, the picture frame can be narrowed.

MODES FOR CARRYING OUT THE INVENTION

Figure 1:
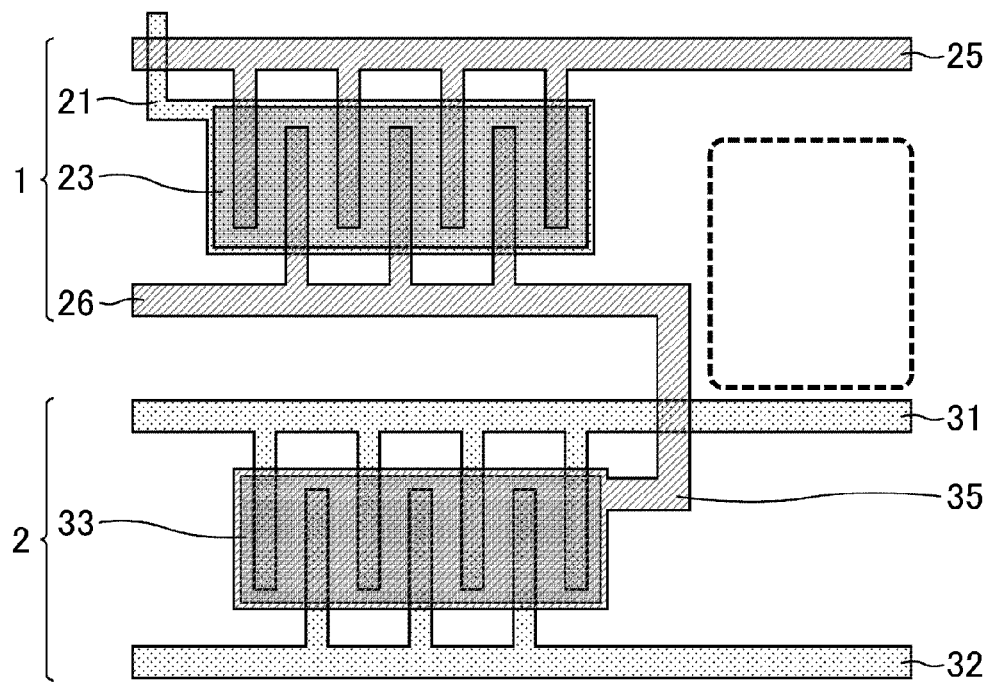
FIG. 1 is a schematic plan view showing a connecting portion between a bottom gate TFT and a top gate TFT of a circuit board of Embodiment 1.

The present invention will be mentioned in more detail referring to the drawings in the following embodiments, but is not limited to these embodiments.

Embodiment 1

Figure 2:
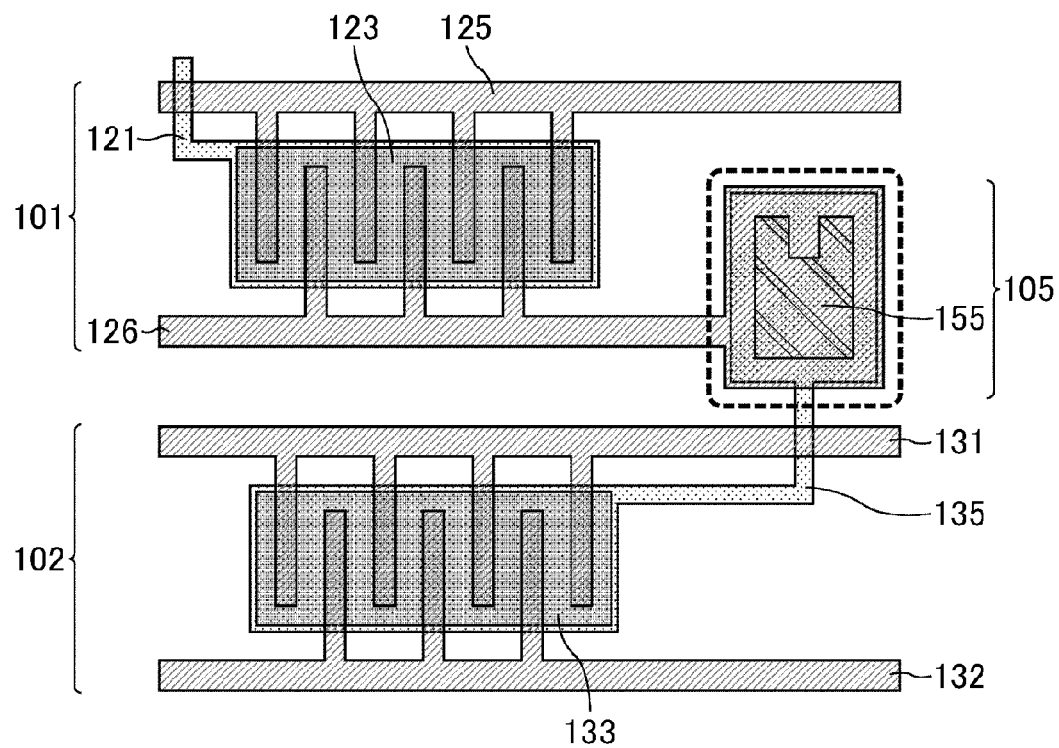
FIG. 2 is a schematic plan view showing a connecting portion between two bottom gate TFTs of a circuit board of Comparative Example 1.

FIG. 1 is a schematic plan view showing a connecting portion between a bottom gate TFT and a top gate TFT of a circuit board of Embodiment 1. On the other hand, FIG. 2 is a schematic plan view showing a connecting portion between two bottom gate TFTs of a circuit board of Comparative Example 1.

As shown in FIG. 1, the circuit board of Embodiment 1 comprises a bottom gate TFT 1 disposed on the upstream side and a top gate TFT 2 disposed on the downstream side. The bottom gate TFT 1 and the top gate TFT 2 are connected to each other, and a drain electrode (first drain electrode) 26 of the bottom gate TFT 1 and a gate electrode (second gate electrode) 35 of the top gate TFT 2 are directly connected. Thus, these electrodes have the same electric potential. No other TFT is interposed between the bottom gate TFT 1 and the top gate TFT 2. In other words, the circuit board of Embodiment 1 corresponds to the first circuit board of the present invention.

The bottom gate TFT 1 comprises a semiconductor layer (first semiconductor layer) 23, a gate electrode (first gate electrode) 21, a source electrode (first source electrode) 25, and the drain electrode (first drain electrode) 26. As shown in FIG. 1, in the bottom gate TFT 1, the source electrode 25 and the drain electrode 26 each have a comb-shaped structure, and the teeth of the respective electrodes are oppositely interposed at uniform intervals. The semiconductor layer 23 is interposed between the source electrode 25 and the drain electrode 26, and the source electrode 25 and the drain electrode 26 are electrically connected at the timing when a scanning signal is supplied to the gate electrode 21.

The top gate TFT 2 comprises a semiconductor layer (second semiconductor layer) 33, the gate electrode (second gate electrode) 35, a source electrode (second source electrode) 31, and a drain electrode (second drain electrode) 32. Also, in the top gate TFT 2, the source electrode 31 and the drain electrode 32 each have a comb-shaped structure, and the teeth of the respective electrodes are oppositely interposed at uniform intervals.

The semiconductor layer 33 is interposed between the source electrode 31 and the drain electrode 32, and the source electrode 31 and the drain electrode 32 are electrically connected at the timing when a scanning signal is supplied to the gate electrode 35.

In Embodiment 1, a signal supplied to the drain electrode 26 of the bottom gate TFT 1 can be supplied to the gate electrode 35 of the top gate TFT 2 as a scanning signal for the top gate TFT 2 without disposing, between the bottom gate TFT 1 and the top gate TFT 2, a contact portion for connecting the drain and the gate.

In contrast, as shown in FIG. 2, the circuit board of Comparative Example 1 comprises a bottom gate TFT 101 disposed on the upstream side and a bottom gate TFT 102 disposed on the downstream side. A contact portion 105 is disposed between the bottom gate TFT 101 and the bottom gate TFT 102, and the bottom gate TFT 101 and the bottom gate TFT 102 are connected to each other through the contact portion 105. The contact portion 105 is a structure disposed so as to connect the drain electrode 126 of the bottom gate TFT 101 and the gate electrode 135 of the bottom gate TFT 102, which are on different layers. In order that the drain electrode 126 of the bottom gate TFT 101 and the gate electrode 135 of the bottom gate TFT 102 have the same electric potential, the contact portion 105 is necessarily formed.

Figure 3:
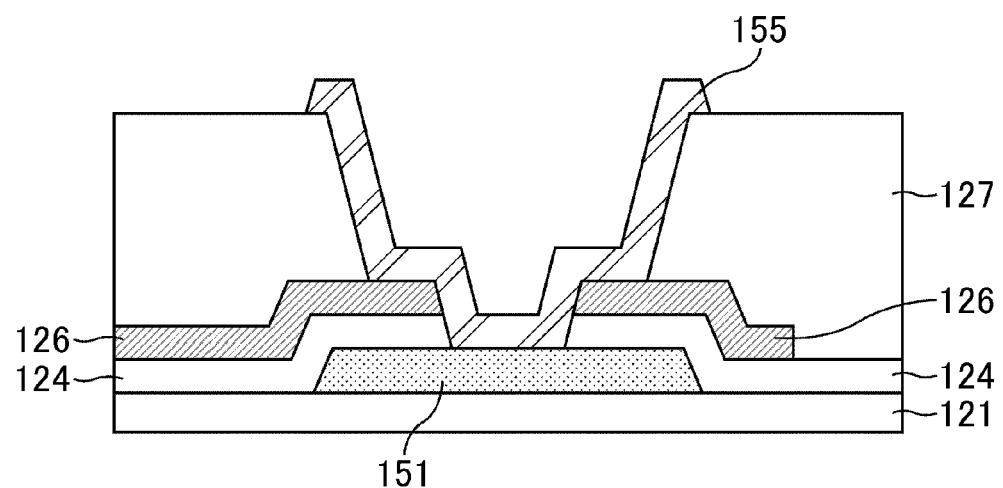
FIG. 3 is a schematic cross-sectional view showing a contact portion of the circuit board of Comparative Example 1.

FIG. 3 is a schematic cross-sectional view showing the contact portion of the circuit board of Comparative Example 1. A contact hole is formed so as to penetrate a second insulator 124 and a third insulator 127, and a transparent electrode film 155 used in the pixel electrode is formed so as to cover the surfaces of the exposed gate electrode 151, second insulator 124, drain electrode 126, and third insulator 127.

The structure of Comparative Example 1 essentially requires formation of a contact portion even in the case that two top gate TFTs are used in combination.

Figure 18:
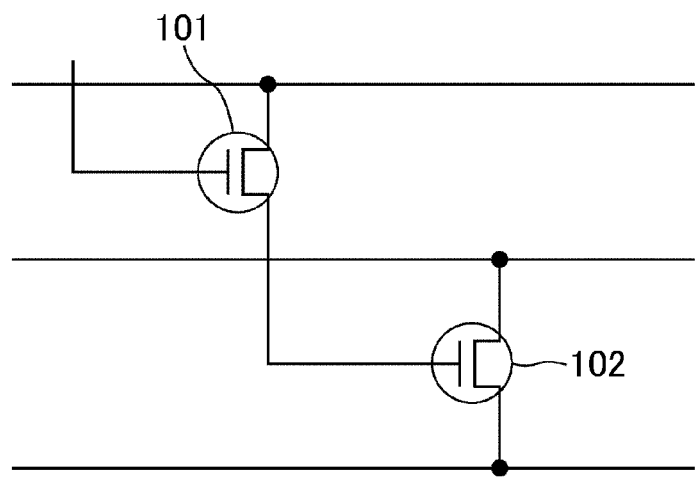
FIG. 18 is a circuit diagram showing a part of a driving circuit of a common display device.
Figure 19:
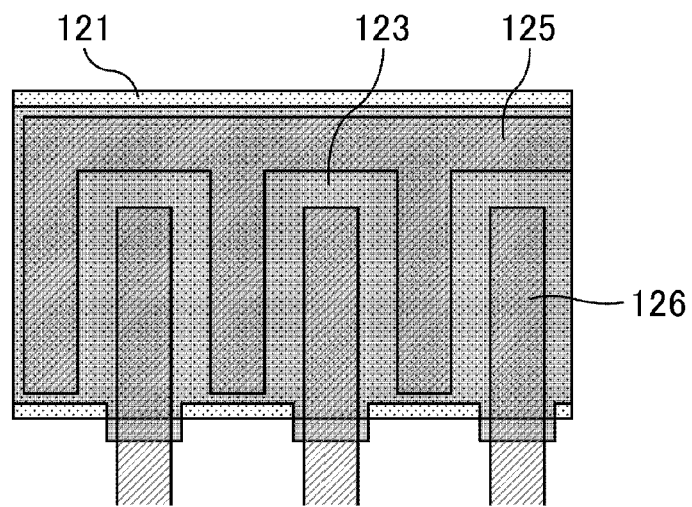
FIG. 19 is a schematic plan view showing a part of the structure of a TFT of a driving circuit of a common display device.
Figure 20:
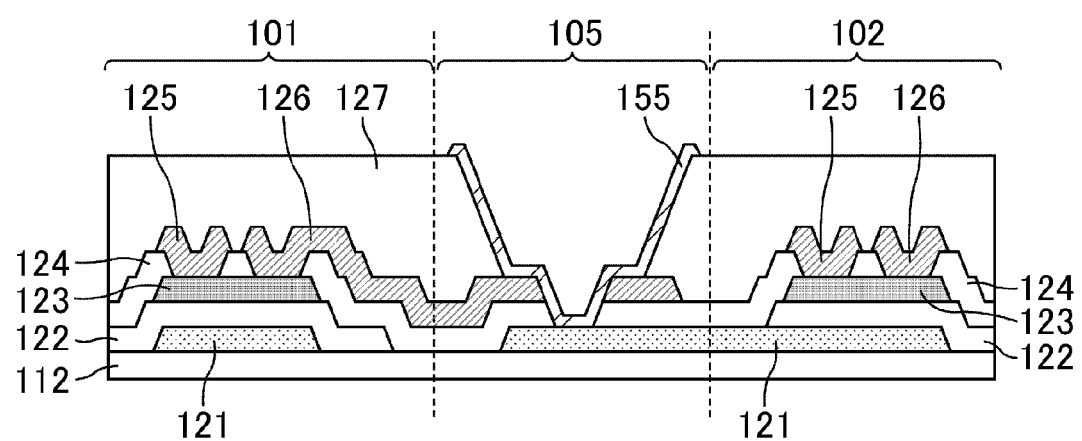
FIG. 20 is a schematic cross-sectional view showing a part of the structure of a TFT of a driving circuit of a common display device.

As is evident from the comparison between FIG. 1 and FIG. 2, in the circuit board of Comparative Example 1, two TFTs each of which are of bottom gate constitute a part of the circuit. Thus, a contact portion for connecting the drain and the gate is required to be formed between the TFTs, and a certain area of space is required to be secured. In contrast, in the circuit board of Embodiment 1, a bottom gate TFT and a top gate TFT each having an opposite structure constitute a part of the circuit. Thus, a contact portion is not required to be additionally formed, and the circuit area can be reduced. Specifically, the area defined by a dotted line in FIG. 1 is an empty space. Other components can be disposed in this area, and thus the circuit area can be reduced as a whole. The circuit diagram of the circuit board of Embodiment 1 is the same as the circuit diagram shown in FIG. 18.

Figure 4:
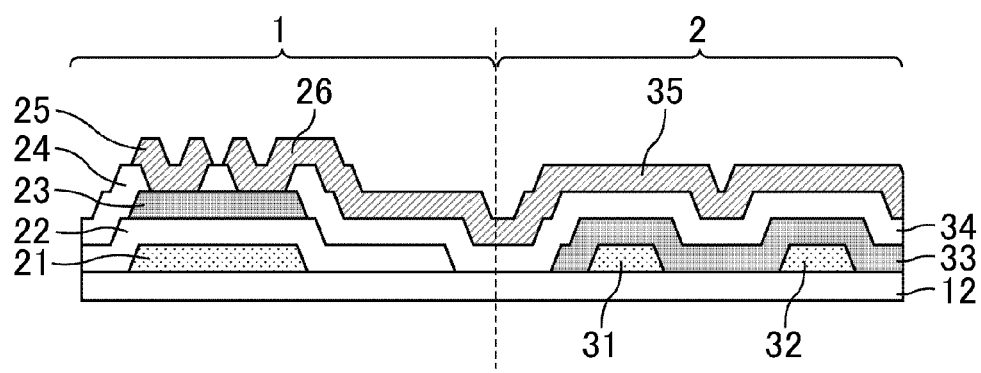
FIG. 4 is a schematic cross-sectional view of the circuit board of Embodiment 1.

FIG. 4 is a schematic cross-sectional view of the circuit board of Embodiment 1. As shown in FIG. 4, the circuit board of Embodiment 1 comprises a glass substrate 12 as a base, and the bottom gate TFT 1 and the top gate TFT 2 are disposed on the glass substrate 12. The glass substrate 12 may be replaced by one produced from another material as long as the surface shows an insulating property.

In Embodiment 1, the bottom gate TFT 1 comprises a gate electrode 21, a gate insulator (first insulator) 22, a semiconductor layer 23, a second insulator 24, and a source electrode 25 and drain electrode 26, laminated in the order set forth from the side of the glass substrate 12. Further, in Embodiment 1, the top gate TFT 2 comprises a source electrode 31 and drain electrode 32, a semiconductor layer 33, a gate insulator (fourth insulator) 34, and a gate electrode 35, laminated in the order set forth from the side of the glass substrate 12. The following will describe methods for producing the bottom gate TFT 1 and the top gate TFT 2 in detail.

First, a conductive film with a thickness of 200 to 600 nm is formed on a glass substrate 12 by sputtering, and then the film is patterned into a predetermined shape by photolithography. Thereby, a gate electrode 21 of the bottom gate TFT 1, a source electrode 31 of the top gate TFT 2, and a drain electrode 32 of the top gate TFT 2 are formed. Suitable examples of the material for these electrodes include high-melting-point metals such as tantalum (Ta), tungsten (W), titanium (Ti), and molybdenum (Mo), and alloys and compounds mainly containing such a high-melting-point metal. Suitable examples of the compounds mainly containing a high-melting-point metal include nitrides. Thereby, the gate electrode 21 of the bottom gate TFT 1, the source electrode 31 of the top gate TFT 2, and the drain electrode 32 of the top gate TFT 2 can be collectively produced such that the electrodes are disposed on the same layer and are formed from the same material.

Next, a gate insulator 22 for the bottom gate TFT 1 is formed on the gate electrode 21 of the bottom gate TFT 1. The gate insulator 22 can be formed by forming an insulator with a thickness of 30 to 100 nm by plasma CVD or sputtering using a silicon-containing insulating material (e.g. $SiO_2$, SiN, SiNO) and then patterning the film into a predetermined shape by photolithography.

Next, semiconductor layers 23 and 33 are formed on the gate insulator 22 of the bottom gate TFT 1 and the source electrode 31 and drain electrode 32 of the top gate TFT 2. The material for the semiconductor layers 23 and 33 may be a silicon-based material such as noncrystalline silicon (amorphous silicon), microcrystalline silicon, multicrystalline silicon (polysilicon), or monocrystalline silicon, and it is preferably an oxide semiconductor (IGZO) containing In, Ga, Zn, and O. In the case of using an oxide semiconductor, a material of the oxide semiconductor with a thickness of 10 to 300 nm is deposited by sputtering to form a film, and then the film is patterned into a predetermined shape by photolithography to form semiconductor layers. Thereby, the semiconductor layer 23 of the bottom gate TFT 1 and the semiconductor layer 33 of the top gate TFT 2 can be collectively produced such that the layers are disposed on the same layer and are formed from the same material. Since oxide semiconductors have better conductive characteristics than semiconductor materials prepared by doping of impurities (e.g. $N^+$), the channel width of each TFT can be smaller than that of common one. Thereby, the circuit area can be reduced.

Next, a second insulator 24 for the bottom gate TFT 1 and a gate insulator 34 for the top gate TFT 2 are formed. First, an insulator with a thickness of 30 to 100 nm is formed on the entire face, and then patterned by photolithography so that an opening is formed at a portion where the source electrode 25 and the drain electrode 26 of the bottom gate TFT 1 are to be electrically connected to the semiconductor layer 23.

Then, a conductive film with a thickness of 200 to 600 nm is formed by sputtering and is patterned into a predetermined shape by photolithography, thereby forming a source electrode 25 of the bottom gate TFT 1, a drain electrode 26 of the bottom gate TFT 1, and a gate electrode 35 of the top gate TFT 2. Examples of a suitable material for these electrodes include high-melting-point metals such as tantalum (Ta), tungsten (W), titanium (Ti), and molybdenum (Mo), and alloys and compounds mainly containing such a high-melting-point metal. Suitable examples of the compounds mainly containing a high-melting-point metal include nitrides. Thereby, the source electrode 25 of the bottom gate TFT 1, the drain electrode 26 of the bottom gate TFT 1, and the gate electrode 35 of the top gate TFT 2 can be collectively produced such that the electrodes are disposed on the same layer and are formed from the same material.

Figure 5:
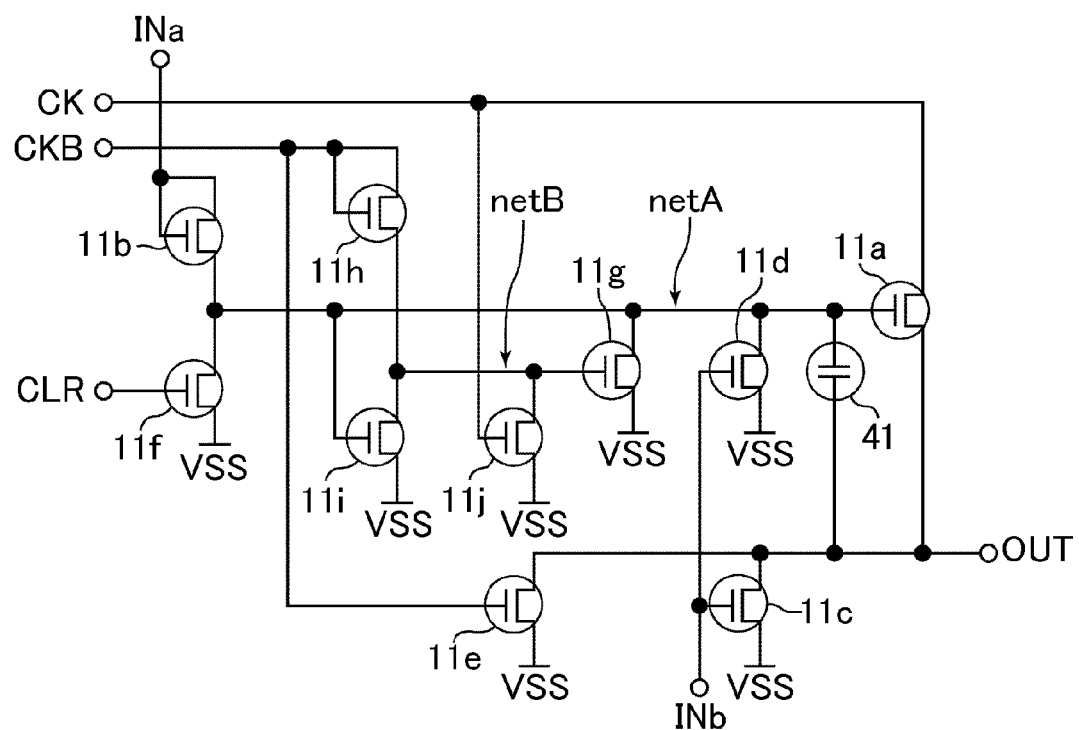
FIG. 5 is a circuit diagram of a unit circuit of the circuit board of Embodiment 1.

The following will describe the structure of the circuit board of Embodiment 1 in detail. In Embodiment 1, the circuit board has a circuit in which multiple unit circuits are cascade-connected. FIG. 5 is a circuit diagram of a unit circuit of the circuit board of Embodiment 1, and the unit circuit constitutes a shift resistor. Each unit circuit has input terminals INa and INb, clock terminals CK and CKB, power terminals VSS, a clear terminal CLR, and an output terminal OUT.

As shown in FIG. 5, each unit circuit has TFTs 11*a* to 11*j* and a capacitance part 41. The drain of the TFT 11*a* is connected to the clock terminal CK and the source is connected to the output terminal OUT. The drain and the gate of the TFT 11*b* are connected to the input terminal INa, and the source is connected to the gate of the TFT 11*a*. The capacitance part 41 is disposed between the gate and the source of the TFT 11*a*. The drain of the TFT 11*c* is connected to the output terminal OUT and the drain of the TFT 11*d* is connected to the gate of the TFT 11*a*. The gates of the TFTs 11*c* and 11*d* are connected to the input terminal INb, and the sources are connected to the power terminals VSS.

The drain of the TFT 11*e* is connected to the output terminal OUT, the gate is connected to the clock terminal CKB, and the source is connected to the power terminal VSS. The drain of the TFT 11*f* is connected to the gate of the TFT 11*a*, the gate is connected to the clear terminal, and the source is connected to the power terminal VSS.

The drain of the TFT 11*g* is connected to the gate of the TFT 11*a*, and the source is connected to the power terminal VSS. The gate of the TFT 11*g* is connected to the source of the TFT 11*h* and the drains of the TFTs 11*i* and 11*j*. The drain and the gate of the TFT 11*h* are connected to the clock terminal CKB. The gate of the TFT 11*i* is connected to the gate of the TFT 11*a*, and the source is connected to the power terminal VSS. The gate of the TFT 11*j* is connected to the clock terminal CK, and the source is connected to the power terminal VSS.

The TFT 11*a* is disposed between the clock terminal CK and the output terminal OUT, and it serves as an output transistor (transmission gate) for determining whether or not it allows a clock signal to pass through the transistor based on a gate electric potential. Further, the gate of the TFT 11*a* is capacitively coupled with a conductive terminal (source) on the side of the output terminal OUT. Thus, as mentioned later, the gate electric potential of the TFT 11*a* is higher than the high-level electric potential of the clock signal CK during the period when the TFT 11*a* is at an on-state and the clock signal CK is at a high level. Hereinbelow, the node connected to the gate of the TFT 11*a* is referred to as a netA.

Figure 6:
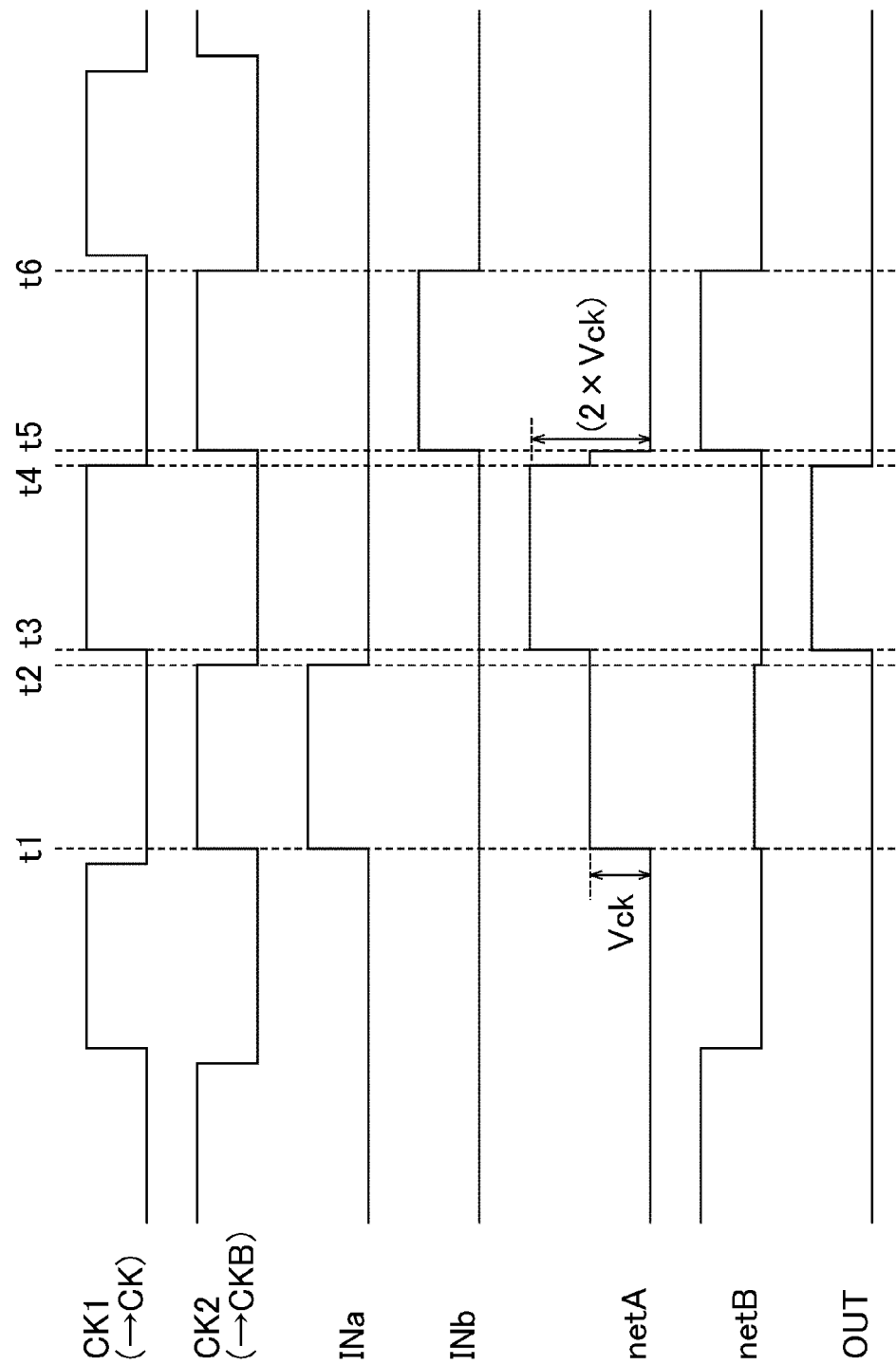
FIG. 6 is a timing chart of signals of the circuit board of Embodiment 1.

FIG. 6 is a timing chart of the respective signals of the circuit board of Embodiment 1. FIG. 6 shows changes in voltage of input and output signals and the node netA of odd-numbered unit circuits. A clock signal CK1 and a clock signal CK2 are input from the clock terminal CK and the clock terminal CKB, respectively, into the odd-numbered unit circuits. The clock signal CK1 is a clock signal in which the period when the electric potential is at a high level is slightly shorter than the ½ cycle. The clock signal CK2 is a signal delayed from the clock signal CK1 by ½ cycle. In other words, the clock signal CK1 and the clock signal CK2 show a phase relationship such that the periods when the electric potential is at a high level do not overlap each other.

In the following, the high-level electric potential is referred to as VGH and the low-level electric potential as VGL, unless otherwise mentioned. Further, the power terminal VSS is treated as an equivalence of the low-level electric potential VGL. In addition, a signal input or output through a certain terminal in the circuit is referred to as the same name of the terminal. For example, a signal input through the clock terminal CK is referred to as a clock signal CK. Furthermore, n and m each are an integer of 2 or greater, i is an integer of 1 or greater and n or smaller, and j is an integer of 1 or greater and m or smaller.

A start pulse SP is at a high level for the same period as that during which the electric potential of the clock signal CK1 is at a high level before start of shift motion. An end pulse is at a high level for the same period as that during which the electric potential of the clock signal CK1 is at a high level after finish of shift motion.

At the time t1, the input signal INa (output signal of the previous unit circuit) changes from a low level to a high level and the electric potential of the node netA also changes to a high level through the diode-connected TFT 11*b*, and thereby the TFT 11*a* turns into an on-state.

At the time t2, the input signal INa changes to a low level, and thereby the TFT 11*b* turns into an off-state and the node netA turns into a floating state, whereas the TFT 11*a* keeps the on-state.

At the time t3, the clock signal CK (clock signal CK1) changes from a low level to a high level, and thereby the electric potential of the node netA rises to about twice as high as the amplitude Vck (=VGH−VGL) of the clock signal owing to a bootstrap effect. Since the gate electric potential of the TFT 11*a* is sufficiently high, the clock signal CK passes through the TFT 11*a* without voltage drop.

During the time between the time t3 and the time t4, that is, the period in which the clock signal CK is at a high level, the electric potential of the node netA is about twice as high as Vck and the output signal OUT is at a high level.

At the time t4, the electric potential of the node netA changes to a high level and the output signal OUT changes to a low level.

At the time t5, the input signal INb (output signal of the following unit circuit) changes from a low level to a high level, and thereby the TFTs 11*c* and 11*d* turn into an on-state. While the TFT 11*c* is at the on-state, a low-level electric potential is applied to the output terminal OUT. As the TFT 11*d* turns into an on-state, the electric potential of the node netA changes to a low level and the TFT 11*a* turns into an off-state.

At the time t6, the input signal INb changes to a low level, and thereby the TFTs 11c and 11d turn into an off-state. At this time, the node netA turns into a floating state, while the TFT 11a keeps the off-state. Ideally, the TFT 11a keeps the off-state and the output signal OUT keeps the low level until the input signal INa reaches the next high level.

The TFT 11e is at an on-state when the clock signal CKB (clock signal CK2) is at a high level. Thus, every time the clock signal CKB changes to a high level, a low-level electric potential is applied to the output terminal OUT. As mentioned here, the TFT 11e has a function of repeatedly setting the output terminal OUT to a low level and thereby stabilizing the output signal OUT.

The TFT 11f is at an on-state when the clear signal CLR (clear pulse CP) is at a high level. At this time, a low-level electric potential is applied to the node netA. As mentioned here, the TFT 11f has a function of initializing the electric potential of the node netA to a low level.

The TFT 11h is at an on-state when the clock signal CKB (clock signal CK2) is at a high level. At this time, the high-level electric potential of the clock signal CKB is applied to the node netB. The TFT 11i is at an on-state when the electric potential of the node netA is not lower than Vck. At this time, a low-level electric potential is applied to the node netB. The TFT 11j is at an on-state when the clock signal CK (clock signal CK1) is at a high level. At this time, a low-level electric potential is applied to the node netB.

Thus, the electric potential of the node netB is at a high level only when the clock signal CK is at a low level, the clock signal CKB is at a high level, and the electric potential of the node netA is at a low level, whereas it is at a low level in any other cases. The TFT 11g is at an on-state when the electric potential of the node netB is at a high level. At this time, a low-level electric potential is applied to the node netA. As mentioned here, the TFTs 11g to 11j each have a function of maintaining the low-level electric potential applied to the electric potential of the node netA.

As mentioned above, the TFTs 11c and 11e each are a TFT (sink-down TFT) for applying a low-level voltage to the output terminal OUT when the output signal OUT is not output.

On the other hand, the TFTs 11d, 11f to 11h, and 11j each are a TFT (sink-down TFT) for applying a low-level voltage to the node netA connected to the gate of the TFT 11a except the period for turning the TFT 11a (output TFT) into an on-state.

The TFT 11i is a TFT which turns into an on-state in response to input of the input signal INa and which has a function of applying a low-level voltage to the node netB. Thus, the TFT 11g is not at an on-state during this period, and thereby an input signal INa is applied to the node netA. As mentioned here, the TFT 11i is a TFT (sink-down TFT) for applying a low-level voltage to the node netB connected to the gate of the TFT 11g during the period for turning the TFT 11a (output TFT) into an on-state.

Figure 7:
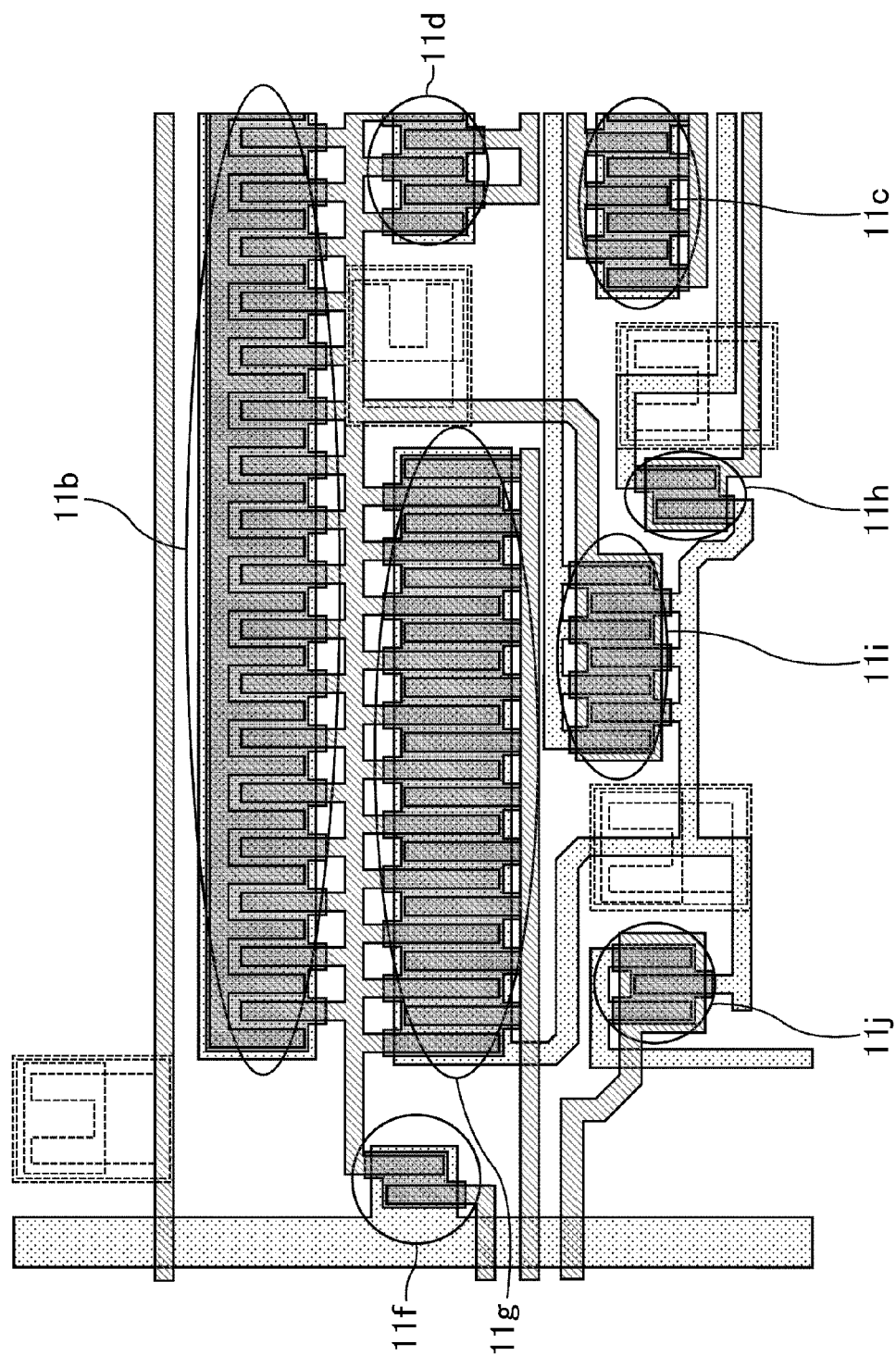
FIG. 7 is a schematic plan view showing a part of the circuit board of Embodiment 1.
Figure 8:
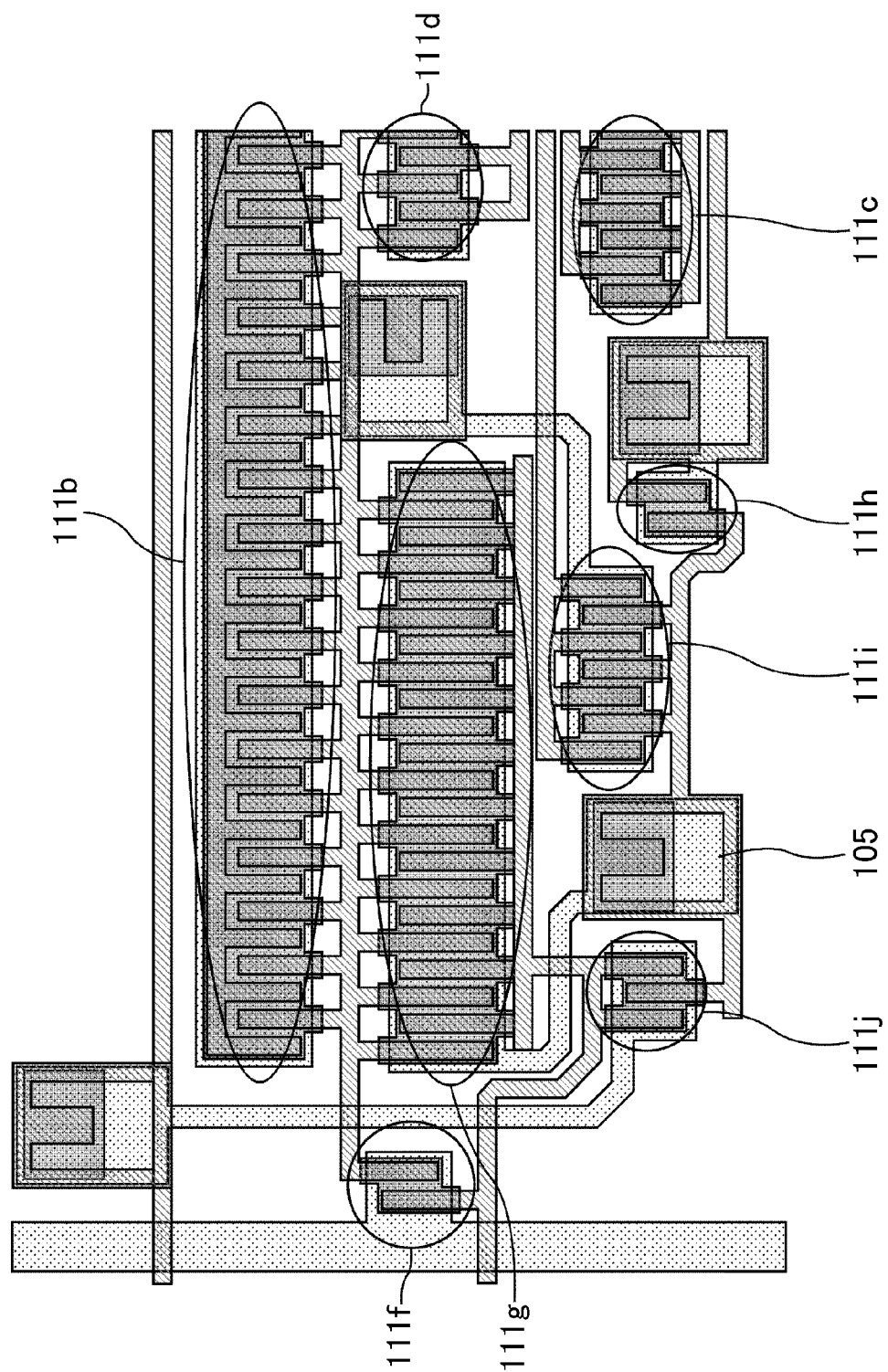
FIG. 8 is a schematic plan view showing a part of the circuit board of Comparative Example 1.

FIG. 7 is a schematic plan view showing a part of the circuit board of Embodiment 1. FIG. 8 is a schematic plan view showing a part of the circuit board of Comparative Example 1. Although the circuit board of Embodiment 1 and the circuit board of Comparative Example 1 are the same circuit board with respect to the circuit, the actual structures thereof are different from each other. The TFTs 11b, 11c, 11d, 11f, 11g, 11h, 11i, and 11j shown in FIG. 7 correspond to the TFT 11b, 11c, 11d, 11f, 11g, 11h, 11i, and 11j shown in FIG. 5, respectively. The TFTs are connected to each other via extracting lines and, if necessary, a contact portion is formed.

In Embodiment 1, the TFTs 11b, 11c, 11d, 11f, and 11g are bottom gate TFTs, whereas the TFTs 11h, 11i, and 11j are top gate TFTs. Further, the TFTs 11b, 11c, 11d, 11i, and 11j each are a TFT in which its source electrode and drain electrode have a comb-shaped structure, whereas the TFTs 11f and 11h each are a TFT in which its source electrode and drain electrode do not have a comb-shaped structure. In contrast, in Comparative Example 1, all the TFTs 11b, 11c, 11d, 11f, 11g, 11h, 11i, and 11j are bottom gate TFTs.

As shown in FIG. 7, in the circuit board of Embodiment 1, the combination of the bottom gate TFT and the top gate TFT constitutes a part of the circuit. Thus, the TFTs can be connected without any contact portion, and thereby the circuit area can be reduced. In contrast, as shown in FIG. 8, the combination of two bottom gate TFTs constitutes a part of the circuit in the circuit board of Comparative Example 1. Thus, a contact portion is required at a certain part. In FIG. 7, the contact portion defined by a dotted line is a contact portion which is unnecessary in Embodiment 1. Specifically, in Embodiment 1, the contact portion for connecting the TFT 11b and the TFT 11i and the contact portion for connecting the TFT 11h and the TFT 11g can be excluded. As is evident from the comparison between FIG. 7 and FIG. 8, the circuit board of Embodiment 1 can greatly reduce the circuit area.

Even in Embodiment 1, a contact portion may be formed, if necessary, in order to avoid overlapping of lines, for example.

Figure 9:
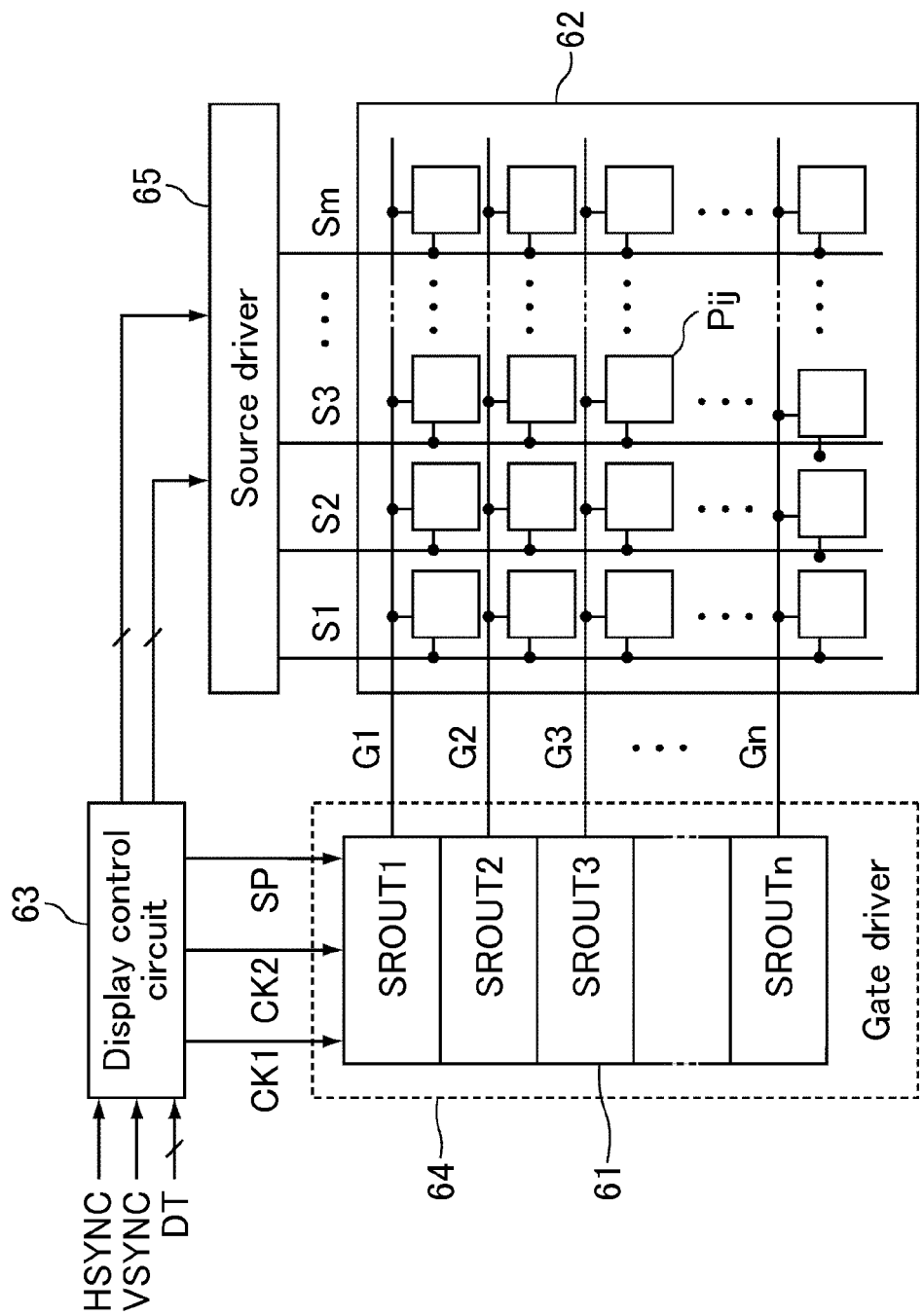
FIG. 9 is a block diagram in the case of applying the circuit board of Embodiment 1 to an active matrix type liquid crystal display device.

FIG. 9 is a block diagram in the case of applying the circuit board of Embodiment 1 to an active matrix type liquid crystal display device. As shown in FIG. 9, the liquid crystal display device of Embodiment 1 comprises a pixel part 62, a display control circuit 63, a gate driver 64, and a source driver 65. In Embodiment 1, the combination of the bottom gate TFT and the top gate TFT of the present invention constitutes a part of a shift resistor 61, and this is employed in the gate driver 64.

The pixel part 62 and the gate driver 64 are formed on a transparent insulating substrate such as a glass substrate; the source driver 65 is formed on a flexible printed circuit; and the display control circuit 63 is formed on a control substrate. As mentioned here, the gate driver 64 is monolithically formed with the pixel part 62 on one substrate. Gate drivers called "gate monolithic", "gate driverless", "panel built-in gate driver, "gate in panel", and the like may be included in the scope of the gate driver 64.

The pixel part 62 comprises n stages of scanning signal lines G1 to Gn, m data signal lines S1 to Sm, and (m×n) pixel circuits Pij. The scanning signal lines G1 to Gn are disposed in parallel with each other, and the data signal lines S1 to Sm are disposed in parallel with each other and perpendicular to the scanning signal lines G1 to Gn. Near the intersection point of a scanning signal line Gi and a data signal lines Sj is disposed a pixel circuit Pij. Such (m×n) pixel circuits Pij are disposed in a two-dimensional state (in a matrix state), that is, m circuits in the row direction and n circuits in the column direction. The scanning signal line Gi is connected to the pixel circuits Pij disposed on the i-th row, and the data signal line Sj is connected to the pixel circuits Pij disposed on the j-th column. Each pixel circuit Pij is provided with a TFT for pixel as a switching element. The gate electrode of the TFT for pixel is connected to the scanning signal line Gi, the source electrode of the TFT is connected to the data signal lines Sj, and the drain electrode of the TFT for pixel is connected to the pixel electrode.

To the display control circuit 63 of the liquid crystal display device of Embodiment 1 are supplied control signals such as a horizontal synchronizing signal HSYNC and a vertical synchronizing signal VSYNC, and display data DT. Based on these signals, the display control circuit 63 outputs the clock signals CK1 and CK2 and the start pulse SP to the gate driver 64, and outputs the control signal SC and the display data DT to the source driver 65.

The gate driver 64 comprises n shift resistors 61. The shift resistors 61 sequentially control the output signals SROUT1 to SROUTn to a high level (indicating a selected state) one by one based on the clock signals CK1 and CK2. The output signals SROUT1 to SROUTn are supplied to the scanning signal lines G1 to Gn, respectively. Thereby, the scanning signal lines G1 to Gn are sequentially selected one by one, and the pixel circuits Pij on one row are collectively selected.

The source driver 65 applies a voltage according to the display data DT to the data signal lines S1 to Sm based on the control signal SC and the display data DT. Thereby, a voltage according to the display data DT is written on the pixel circuits Pij on the selected row. As a result, the liquid crystal display device 100 displays an image.

The picture frame of the liquid crystal display device of Embodiment 1 can be narrowed because an excessive contact portion is not required to be formed in the driving circuit.

Embodiment 2

The circuit board of Embodiment 2 is identical to that of Embodiment 1 except that the connecting order of the bottom gate TFT and the top gate TFT is opposite to that in Embodiment 1. In other words, the circuit board of Embodiment 2 includes a portion where the top gate TFT and the bottom gate TFT are connected in the order set forth. Since the drain electrode (third drain electrode) of the top gate TFT and the gate electrode (fourth drain electrode) of the bottom gate TFT are directly connected, these electrodes have the same electric potential. No other TFT is interposed between the top gate TFT 3 and the bottom gate TFT 4. In other words, the circuit board of Embodiment 2 corresponds to the second circuit board of the present invention. The circuit diagram of the circuit board of Embodiment 2 is identical to FIG. 5 for Embodiment 1.

Figure 10:
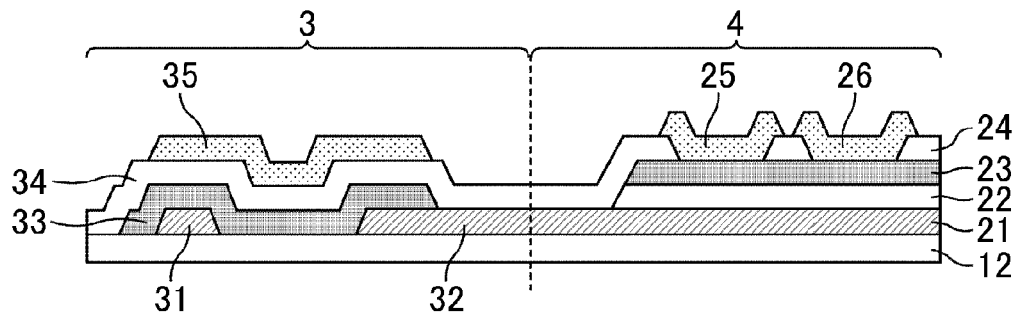
FIG. 10 is a schematic cross-sectional view of a circuit board of Embodiment 2.

FIG. 10 is a schematic cross-sectional view of the circuit board of Embodiment 2. As shown in FIG. 10, the circuit board of Embodiment 2 comprises a glass substrate 12 as a base, and the top gate TFT 3 and the bottom gate TFT 4 are disposed on the glass substrate. The glass substrate 12 may be replaced by one produced from another material as long as the surface shows an insulating property.

In Embodiment 2, the top gate TFT 3 comprises a source electrode 31 and drain electrode 32, a semiconductor layer 33, a gate insulator (fourth insulator) 34, and a gate electrode 35, laminated in the order set forth from the side of the glass substrate 12. Further, in Embodiment 2, the bottom gate TFT 4 comprises a gate electrode 21, a gate insulator (first insulator) 22, a semiconductor layer 23, a second insulator 24, and a source electrode 25 and drain electrode 26, laminated in the order set forth from the side of the glass substrate 12.

As in Embodiment 2, even in the case that the connecting order of the bottom gate TFT and the top gate TFT is opposite to that in Embodiment 1, a contact portion for connecting the lower layer and the upper layer between these TFTs is not required to be formed because the two types of TFTs with opposite structures, that is, the bottom gate TFT and the top gate TFT, are used as in Embodiment 1. Thus, the effect of reducing the circuit area can be achieved.

Embodiment 3

Figure 11:
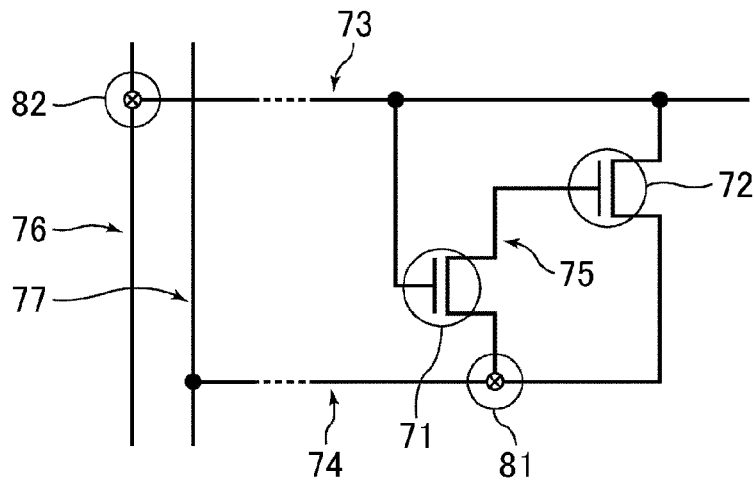
FIG. 11 is a circuit diagram of a circuit board of Embodiment 3.

FIG. 11 is a circuit diagram of a circuit board of Embodiment 3. The circuit board of Embodiment 3 comprises a bottom gate TFT and a top gate TFT connected to each other. The connecting order of the bottom gate TFT and the top gate TFT is not particularly limited, and either the first circuit board of the present invention or the second circuit board of the present invention can be applied to the circuit board of Embodiment 3.

Figure 12:
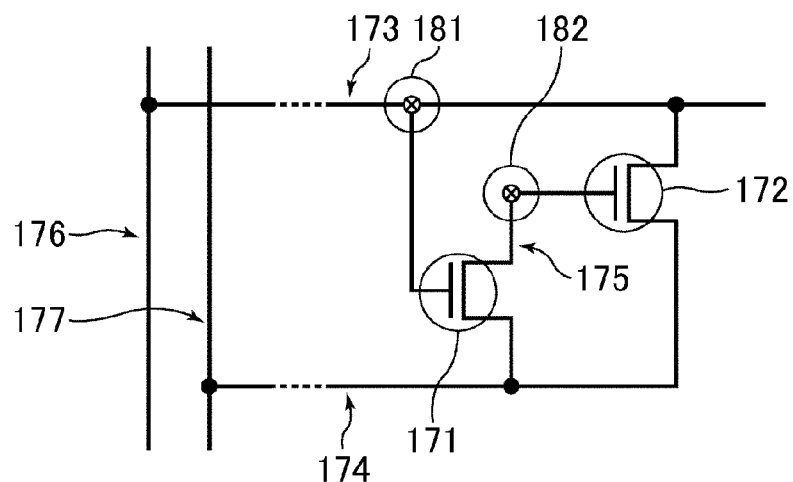
FIG. 12 is a circuit diagram of a circuit board of Comparative Example 2.

FIG. 12 is a circuit diagram of a circuit board of Comparative Example 2. The circuit board of Comparative Example 2 is the same as that of Embodiment 3 with respect to the circuit diagram, but two bottom gate TFTs or two top gate TFTs constitute a part of the circuit. Thus, a contact portion for connecting the drain and the gate is at a different position.

As shown in FIG. 11 and FIG. 12, in the circuit boards of Embodiment 3 and Comparative Example 2, a first extracting line (gate-extracting line) 73 or 173 extends from part of a first signal bus line 76 or 176 and is connected to the gate electrode of an upstream TFT 71 or 171 (hereinafter, also referred to as a first TFT). Further, a second extracting line (source-extracting line) 74 or 174 extends from part of a second signal bus line 77 or 177 and is connected to the source electrode of the first TFT 71 or 171 and the source electrode of a downstream TFT 72 or 172 (hereinafter, also referred to as a second TFT). In addition, a third extracting line (gate-extracting line) 75 or 175 extends between the first TFT 71 or 171 and the second TFT 72 or 172 to connect the first TFT 71 or 171 and the second TFT 72 or 172 to each other.

With such a circuit structure, based on a signal supplied to the gate electrode of the first TFT 71 or 171, a signal supplied to the source electrode of the first TFT 71 or 171 through the second extracting line 74 or 174 is supplied to the gate electrode of the second TFT 72 or 172 through the third extracting line 75 or 175. Also, based on a signal supplied to the gate electrode of the second TFT 72 or 172, a signal supplied to the source electrode of the second TFT 72 or 172 through the second extracting line 74 or 174 is supplied to the drain electrode of the second TFT 72 or 172, and then the signal flows to the outside.

In Embodiment 3 shown in FIG. 11, whole of the first extracting line 73 is formed from the same material as the gate electrode of the first TFT 71 (hereinafter, also referred to as a gate metal), and they are formed on the same layer. The second extracting line 74 has a branch point, and the line is divided into two routes, the route toward the first TFT 71 and the route toward the second TFT 72, from the branch point. Here, the line extending from the second signal bus line 77 to the branch point and the line extending from the branch point to the source electrode of the first TFT 71 are formed from the same material as the source electrode and drain electrode of the first TFT 71 (hereinafter, also referred to as a source metal), and they are formed on the same layer. On the other hand, the line extending from the branch point to the second TFT 72 is formed from the gate metal. On the branch point is formed a contact portion 81 that connects the layer with the source-metal-made line disposed thereon and the layer with the gate-metal-made line disposed thereon, and the layers are connected to each other via the contact portion 81 penetrating an insulator disposed between the layers. The third extracting line 75 connecting the first TFT 71 and the second TFT 72 is formed from the source metal, and it is formed on the same layer as the layer where the aforementioned source-metal-made line is formed. Further, a contact portion 82 penetrating an insulator that partially overlaps the first signal bus line 76 is formed on the branch point of the first signal bus line 76 and the first extracting line 73, and the first signal bus line 76 and the first extracting line 73 are connected to each other via the contact portion 82.

The signal bus lines 76 and 77 are made wider than the intra-circuit lines. Specifically, the signal bus lines 76 and 77 may be formed with a width of 20 to 50 μm. Thus, space required for electrical connection can be secured outside the intra-circuit lines by disposing a contact portion at a position overlapping the first signal bus line 76 and without disposing a contact portion in each unit circuit. As a result, the circuit area can be further reduced.

In Comparative Example 2 shown in FIG. 12, whole of the second extracting line 174 is formed from the source metal. On the other hand, the first extracting line 173 has a branch point, and the line is divided into two routes, the route toward the first TFT 171 and the route toward the outside, from the branch point. Here, the line extending from the branch point to the first TFT 171 is formed from the gate metal and the line extending from the branch point to the outside is formed from the source metal. On the branch point is formed a contact portion 181 that connects the layer with the source-metal-made line disposed thereon and the layer with the gate-metal-made line disposed thereon, and the layers are connected to each other via the contact portion 181 penetrating an insulator disposed between the layers. The third extracting line 75 connecting the first TFT 71 and the second TFT 72 includes a line formed from the gate metal and a line formed from the source metal. These lines are disposed on different layers and are connected to each other via a contact portion 182 penetrating an insulator.

In Comparative Example 2 shown in FIG. 12, two TFTs each of which is of bottom gate type or of top gate type constitute a part of the circuit. Thus, at least two contact portions are required to be formed in the intra-circuit lines. Therefore, in Embodiment 3, the circuit area can be further reduced in comparison with Comparative Example 2.

Embodiment 4

The circuit board of Embodiment 4 is the same as that of Embodiment 2 except for the structure of the top gate TFT. In other words, the circuit board of Embodiment 4 is the second circuit board of the present invention.

Figure 13:
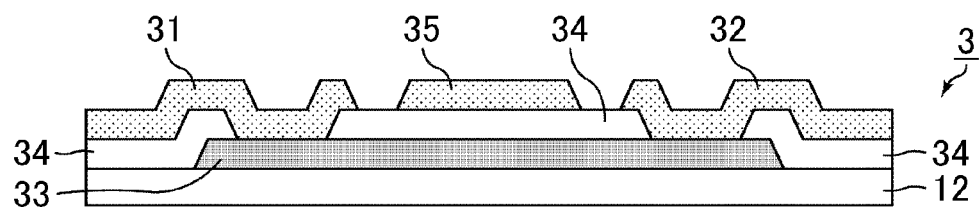
FIG. 13 is a schematic cross-sectional view showing a top gate TFT in a circuit board of Embodiment 4.

FIG. 13 is a schematic cross-sectional view showing a top gate TFT in a circuit board of Embodiment 4. As shown in FIG. 13, in Embodiment 4, a top gate TFT 3 comprises a semiconductor layer 33, a gate insulator (fourth insulator) 34, and a source electrode 31, drain electrode 32, and gate electrode 35, laminated on a glass substrate 12. The source electrode 31, the drain electrode 32, and the gate electrode 35 are formed from the same material and are formed on the same layer. They are disposed at certain intervals so as not to electrically connect to each other. Further, in Embodiment 4, all the electrodes of the top gate TFT 3 are formed from the same material as the source electrode and the drain electrode of the bottom gate TFT.

Such a structure enables to collectively form a source electrode, a drain electrode, and a gate electrode, and thus the production process can be simplified. Further, the top gate TFT and the bottom gate TFT constitute a part of the circuit, and thus the effect of reducing the circuit area owing to reduction in the number of contact portions can be achieved.

Embodiment 5

The circuit board of Embodiment 5 is the same as that of Embodiment 2 except for the structure of the top gate TFT. In other words, the circuit board of Embodiment 5 is the second circuit board of the present invention.

Figure 14:
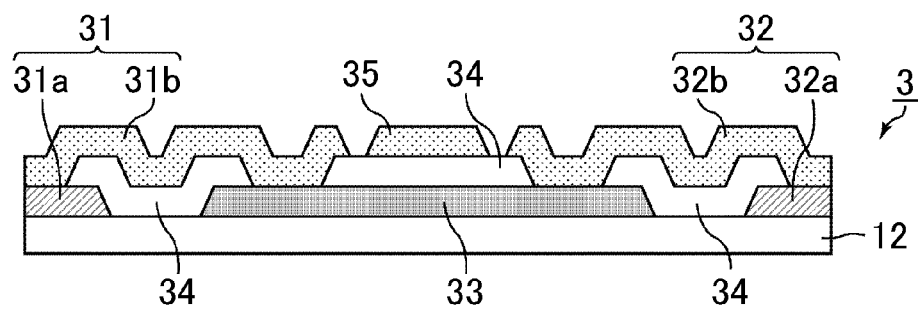
FIG. 14 is a schematic cross-sectional view showing a top gate TFT in a circuit board of Embodiment 5.
Figure 15:
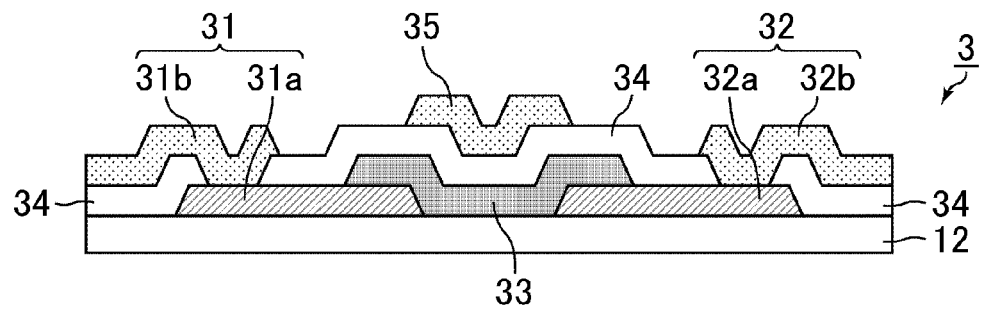
FIG. 15 is a schematic cross-sectional view showing the top gate TFT in the circuit board of Embodiment 5.

FIGS. 14 and 15 each are a schematic cross-sectional view showing a top gate TFT in a circuit board of Embodiment 5. As shown in FIG. 14 and FIG. 15, in Embodiment 5, the top gate TFT 3 comprises a semiconductor layer 33, a gate insulator (fourth insulator) 34, and a source electrode 31, drain electrode 32, and gate electrode 35, laminated on a glass substrate 12. The source electrode 31, the drain electrode 32, and the gate electrode 35 are at least partially formed from the same material. The source electrode 31 and the drain electrode 32, however, are formed by lamination of different materials, and thus the layer structure of them is different from that of the gate electrode 35.

Specifically, the source electrode 31 and the drain electrode 32 of the top gate TFT 3 each are divided into a lower film 31a or 32a and an upper film 31b or 32b. The lower films 31a and 32a are formed from the same material as the gate electrode of the bottom gate TFT, whereas the upper films 31b and 32b are formed from the same material as the source electrode and the drain electrode of the bottom gate TFT.

Further, the gate electrode of the bottom gate TFT and the lower film 31a of the source electrode and the lower film 32a of the drain electrode of the top gate TFT 3 are formed on the same layer. The source electrode and the drain electrode of the bottom gate TFT and the upper film 31b of the source electrode, the upper film 32b of the drain electrode, and the gate electrode 35 of the top gate TFT 3 are formed on the same layer.

In the example shown in FIG. 14, the lower film 31a of the source electrode and the lower film 32a of the drain electrode are disposed on the same layer as the semiconductor layer 33, whereas in the example shown in FIG. 15, the lower film 31a of the source electrode and the lower film 32a of the drain electrode are disposed on a lower layer than the semiconductor layer 33.

As in Embodiment 5, the respective electrodes of the TFT may be formed by a laminated film, and may be appropriately modified according to its design. Further, since the top gate TFT and the bottom gate TFT constitute a part of the circuit, the effect of reducing the circuit area owing to reduction in the number of contact portions can be achieved.

Embodiment 6

The circuit board of Embodiment 6 is the same as that of Embodiment 2 except for the structure of the top gate TFT. In other words, the circuit board of Embodiment 6 is the second circuit board of the present invention.

Figure 16:
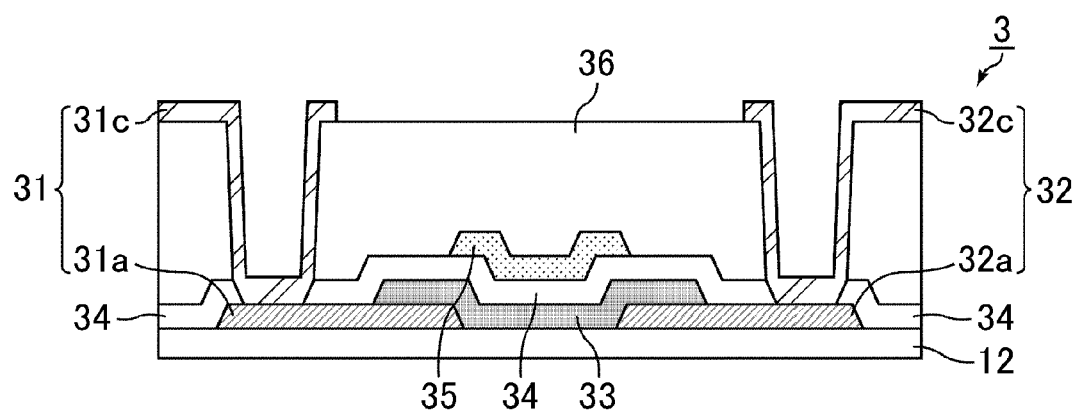
FIG. 16 is a schematic cross-sectional view showing a top gate TFT in a circuit board of Embodiment 6.
Figure 17:
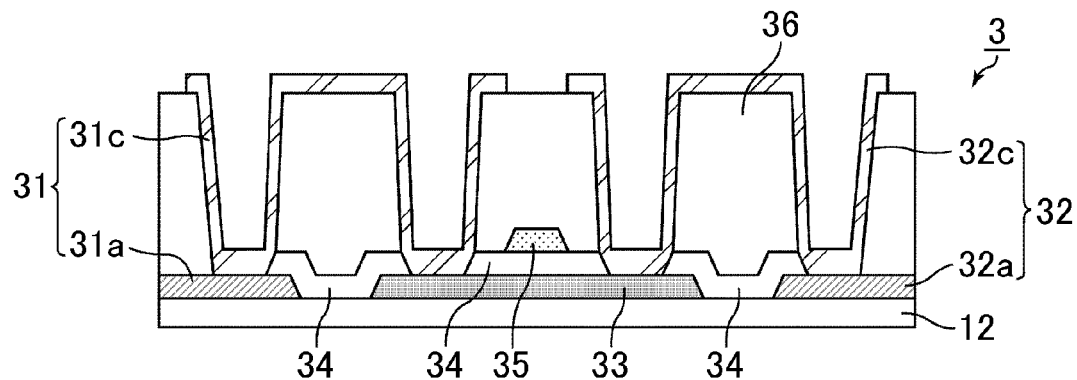
FIG. 17 is a schematic cross-sectional view showing the top gate TFT in the circuit board of Embodiment 6.

FIGS. 16 and 17 each are a schematic cross-sectional view showing a top gate TFT in a circuit board of Embodiment 6. As shown in FIG. 16 and FIG. 17, in Embodiment 6, the top gate TFT 3 comprises a semiconductor layer 33, a gate insulator (fourth insulator) 34, and a source electrode 31, drain electrode 32, and gate electrode 35, laminated on a glass substrate 12. The source electrode 31, the drain electrode 32, and the gate electrode 35 are at least partially formed from the same material. The source electrode 31 and the drain electrode 32, however, are formed by lamination of different materials, and thus the layer structure of them is different from that of the gate electrode 35.

Specifically, the source electrode 31 and the drain electrode 32 of the top gate TFT 3 each are divided into a lower film 31a or 32a and an upper film 31c or 32c. The lower films 31a and 32a are formed from the same material as the gate electrode of the bottom gate TFT, whereas the upper films 31c and 32c are formed from materials different from those of the bottom gate TFT and the top gate TFT 3. The source electrode 31 and the upper films 31c and 32c of the drain electrode 32 of the top gate TFT 3 may be formed using a transparent conductive film such as ITO (indium tin oxide) which is used for a pixel electrode.

The gate electrode of the bottom gate TFT, and the lower film 31a of the source electrode and the lower film 32a of the drain electrode of the top gate TFT 3 are formed on the same layer. The source electrode and the drain electrode of the bottom gate TFT, and the gate electrode 35 of the top gate TFT 3 are formed on the same layer. The upper film 31c of the source electrode and the upper film 32c of the drain electrode of the top gate TFT 3 are formed on the same layer. The gate electrode 35 of the top gate TFT 3 is disposed on a lower layer than the upper film 31c of the source electrode and the upper film 32c of the drain electrode of the top gate TFT 3. A fifth insulator 36 is formed between the gate electrode 35 and the source electrode and drain electrode.

In the example shown in FIG. 16, the lower film 31a of the source electrode and the lower film 32a of the drain electrode of the top gate TFT 3 are disposed on the same layer as the semiconductor layer 33, whereas in the example shown in FIG. 17, the lower film 31a of the source electrode and the lower film 32a of the drain electrode of the top gate TFT 3 are disposed on a lower layer than the semiconductor layer 33.

Also, in the example shown in FIG. 16, the source electrode 31 and the drain electrode 32 of the top gate TFT 3 are connected to the bottom gate TFT through one contact portion, whereas in the example shown in FIG. 17, the source electrode 31 and the drain electrode 32 of the top gate TFT 3 are connected to the bottom gate TFT via two contact portions.

As in Embodiment 6, the respective electrodes of the TFT may be formed by a laminated film, and may be appropriately modified according to its design. Further, since the top gate TFT and the bottom gate TFT constitute a part of the circuit, the effect of reducing the circuit area owing to reduction in the number of contact portions can be achieved.

The present application claims priority to Patent Application No. 2010-111423 filed in Japan on May 13, 2010 under the Paris Convention and provisions of national law in a designated State, the entire contents of which are hereby incorporated by reference.

REFERENCE SIGNS LIST 1, 4: bottom gate TFT (thin film transistor)
2, 3: top gate TFT (thin film transistor)
11a to 11j, 111a to 111j: TFT (thin film transistor)
12, 112: glass substrate
21, 121: gate electrode
22, 122: gate insulator (first insulator)
23, 123: semiconductor layer
24: second insulator
25, 125: source electrode
26, 126: drain electrode
27: third insulator
31, 131: source electrode
31a: lower film
31b, 31c: upper film
32, 132: drain electrode
32a: lower film
32b, 32c: upper film
33, 133: semiconductor layer
34: gate insulator (fourth insulator)
35, 135: gate electrode
36: fifth insulator
41: capacitance part
61: shift resistor
62: pixel part
63: display control circuit
64: gate driver
65: source driver
71, 171: first TFT
72, 172: second TFT
73, 173: first extracting line
74, 174: second extracting line
75, 175: third extracting line
76, 176: first signal bus line
77, 177: second signal bus line
81, 82, 181, 182: contact portion
105: contact portion
124, 127: interlayer insulator
151: gate electrode
155: transparent conductive film

The invention claimed is:

1. A circuit board, comprising:
a bottom gate thin film transistor comprising a first semiconductor layer, a first gate electrode, a first source electrode, a first drain electrode, a first signal bus line, a second signal bus line, a gate-extracting line, and a source-extracting line; and
a top gate thin film transistor comprising a second semiconductor layer, a second gate electrode, a second source electrode, and a second drain electrode,
the first semiconductor layer and the second semiconductor layer being formed from the same material,
the first drain electrode or the first source electrode and the second gate electrode being connected without interposing any other thin film transistor therebetween, and having the same electric potential,
the gate-extracting line which extends from part of the first signal bus line and which is connected to the first gate electrode, and
the source-extracting line which extends from part of the second signal bus line and which is connected to the first source electrode,
wherein the first gate electrode and the gate-extracting line are formed from the same material,
the first source electrode and the source-extracting line are formed from the same material,
the first signal bus line and the gate-extracting line are formed from different materials,
the first signal bus line is wider than the gate-extracting line in width, and
the first signal bus line and the gate-extracting line are connected through a contact portion which penetrates an insulator at a position overlapping the first signal bus line.

2. The circuit board according to claim 1,
wherein the first gate electrode, the second source electrode, and the second drain electrode are formed from the same material.

3. The circuit board according to claim 1,
wherein the first gate electrode, the second source electrode, and the second drain electrode are disposed on the same layer.

4. The circuit board according to claim 1,
wherein the material of the first semiconductor layer and the second semiconductor layer is an oxide semiconductor.

5. The circuit board according to claim 4,
wherein the oxide semiconductor includes indium, gallium, zinc, and oxygen.

6. A circuit board, comprising:
a top gate thin film transistor comprising a third semiconductor layer, a third gate electrode, a third source electrode, a third drain electrode, a third signal bus line, a fourth signal bus line, a gate-extracting line, and a source-extracting line; and
a bottom gate thin film transistor comprising a fourth semiconductor layer, a fourth gate electrode, a fourth source electrode, and a fourth drain electrode,
the third semiconductor layer and the fourth semiconductor layer being formed from the same material,
the third drain electrode or the third source electrode and the fourth gate electrode being connected without interposing any other thin film transistor therebetween, and having the same electric potential,
the gate-extracting line which extends from part of the third signal bus line and which is connected to the first gate electrode, and
the source-extracting line which extends from part of the fourth signal bus line and which is connected to the first source electrode,
wherein the first gate electrode and the gate-extracting line are formed from the same material,
the first source electrode and the source-extracting line are formed from the same material,
the third signal bus line and the gate-extracting line are formed from different materials,
the third signal bus line is wider than the gate-extracting line in width, and
the third signal bus line and the gate-extracting line are connected through a contact portion which penetrates an insulator at a position overlapping the third signal bus line.

7. The circuit board according to claim 6,
wherein the third gate electrode, the fourth source electrode, and the fourth drain electrode are formed from the same material.

8. The circuit board according to claim 6,
wherein the third gate electrode, the fourth source electrode, and the fourth drain electrode are disposed on the same layer.

9. The circuit board according to claim 6,
wherein the material of the third semiconductor layer and the fourth semiconductor layer is an oxide semiconductor.

10. A display device, comprising the circuit board according to claim 1.

11. The circuit board according to claim 9,
wherein the oxide semiconductor includes indium, gallium, zinc, and oxygen.

* * * * *